(12) United States Patent
Tsao et al.

(10) Patent No.: US 7,296,254 B2
(45) Date of Patent: Nov. 13, 2007

(54) SYSTEM AND METHOD FOR USING MPW INTEGRATION SERVICE ON DEMAND

(75) Inventors: Piao-Chuo Tsao, Bade (TW); Yi-Hong Tseng, Hsinchu (TW); Yun-Wen Fu, Kaohsiung Hsien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 327 days.

(21) Appl. No.: 11/047,246

(22) Filed: Jan. 31, 2005

(65) Prior Publication Data

US 2006/0195814 A1    Aug. 31, 2006

(51) Int. Cl.
G06F 17/50 (2006.01)

(52) U.S. Cl. ........................................................ 716/19

(58) Field of Classification Search .................... 716/1, 716/19–21; 700/121, 182, 19, 28, 83, 96, 700/97, 117; 705/500
See application file for complete search history.

(56) References Cited

U.S. PATENT DOCUMENTS 7,003,362 B2 * 2/2006 Tsao et al. .................... 700/97
7,185,009 B2 * 2/2007 Yang et al. ..................... 707/6
2006/0026549 A1 * 2/2006 Tsao et al. .................... 716/19

* cited by examiner

Primary Examiner—Vuthe Siek
(74) Attorney, Agent, or Firm—Thomas, Kayden, Horstemeyer & Risley

(57) ABSTRACT

A system for multi-project wafer service is provided. The system contains integrator and designer interfaces, an account managing device, a mask tooling information processor, a mask database checking device, and a mask tooling information convertor. The integrator and the designer interfaces provide first and second users with access to the multi-project wafer service. The account managing device manages identification information and corresponding access authority. The mask tooling information processor provides a predefined form to the designer interface, receives the form containing the mask tooling information, and presents the completed form to the integrator interface. The mask database checking device compares the mask tooling information to preset data. The mask tooling information convertor converts the mask tooling information into mask tape-out information.

13 Claims, 8 Drawing Sheets

FIG. 3 (RELATED ART)

| Basic Info. | | STI | | LIT Layers | | | | | |
|---|---|---|---|---|---|---|---|---|---|
| Seq. | Process Layer | | Circuit Pattern | | Process Key CAD Layer # | DGTA Tone | Bias / Logic Operation | | Bias/Logic Operation After Translation |
| | ID | Name | CAD Layer # | N/A | | | | | |
| 1 | 119 | WELL-N-DEEP-IMP | | | | | | | |
| 2 | 120 | OD1-ETCH | 6;5 | L | | D | STD Bias/LOP | 0 | (6;5 SIZING 0) |
| 3 | 121 | ODR-ETCH | 73 | L | | C | STD Bias/LOP | (((120 SIZING -0.4) SIZI | (((6;5 SIZING -0.4) SIZING 0.4) SIZING -0.2) |
| 4 | 191 | WELL-P-IMP | 75 | L | | D | STD Bias/LOP | (192 OR NT_N) | (3 OR 2) |
| 5 | 118 | VT-N-CELL-IMP | | | | | | | |
| 6 | 192 | WELL-N-IMP | 3;2 | | | C | STD Bias/LOP | 0 | ((3 OR 2) SIZING 0) |
| 7 | 117 | VT-P-IMP | | | | | | | |
| 8 | 132 | OD2-ETCH | | | | | | | |
| 9 | 130 | POLY-GATE-ETCH | 3;1 | L | | D | STD Bias/LOP | 0 | (3;1 SIZING 0) |
| 10 | 114 | LDD-N-1.8V-IMP | 2;8 | | | C | STD Bias/LOP | ((((198 NOT 192) | ((((((111 SIZING 0.21) SIZING -0.42) SIZING 0.36) SIZING 0.3) SIZING 0.25) SIZING -0.2) SIZING 0.15) SIZING -0.1) SIZING 0.05) NOT 113) |
| 11 | 113 | LDD-P-1.8V-IMP | 3;4 | L | 2;7 | C | Customer Specified | ((((((197 AND 192 | ((((((112 SIZING 0.21) SIZING -0.42) SIZING 0.36) SIZING 0.3) SIZING 0.25) SIZING -0.2) SIZING 0.15) SIZING -0.1) SIZING 0.05) TOP NOT 113) |

FIG. 7

SYSTEM AND METHOD FOR USING MPW INTEGRATION SERVICE ON DEMAND

BACKGROUND

The present invention relates to prototyping and particularly to mask tooling for multi-project wafer (MPW) service integrating multiple design projects into a single mask using a network-based system.

In Integrated Circuit (IC) manufacturing, at least one engineering lot is needed for IC design verification. A conventional engineering lot normally contains 6-12 wafers corresponding to one IC design. While thousands of dies are produced from an engineering lot, the number of dies is far beyond actual needs for IC design verification. When the IC design is verified, the dies are directly released to market. When the IC design fails in verification, the dies are scrapped, creating substantial waste.

Therefore, MPW service has emerged to reduce the cost of IC device prototyping. With MPW, several products can be integrated into a mask set, thus the cost of mask is reduced. Currently, MPW service is provided for different processes, such as 0.13 µm and 0.18 µm processes, and so on.

FIG. 1 is a schematic view of a conventional MPW service. Design information 110 specifies multiple design projects for a MPW, comprising design projects 111, 113, 115, and 117. The design information 110 is then converted to mask tooling information. A mask 120 is then fabricated according to the mask tooling information, and used to manufacture a multi-project wafer 130 accordingly. The mask 120 comprises 4 kinds of IC device defined by design projects 111, 113, 115, and 117, respectively, which are then fabricated to form products 141, 143, 145, and 147, respectively.

FIG. 2 illustrates operation of a conventional MPW service. First, design projects for different IC devices are provided. The design information comprises Government Data Standards (GDS) II data, Mask Tooling (MT) information, and a Design Rule Check (DRC) report. Design projects 211, 213, 215, and 217 are provided by IC designers 201, 203, 205, and 207, respectively. Design projects 211, 213, 215, and 217 are sent to a design service provider 230. The design service provider 230 receives the design projects 211, 213, 215, and 217, and integrates them to generate integrated mask tooling information 231 for a single mask accordingly. The integrated mask tooling information is then transmitted to a mask house 250. The design projects are presented on the same mask set with proper allocation. FIG. 3 illustrates a conventional form for mask tooling information. The form leaves blanks for mask tooling information. Information is determined freely by users, and entered manually, conforming to different formats for different users, whereby the contents thereof may contains errors.

Although conventional MPW service efficiently reduces costs of IC device prototyping, it still presents several disadvantages. These disadvantages can be better understood referring to FIG. 2 and corresponding descriptions.

First, it is difficult for a design service provider to incorporate design information for different devices from different IC designers. The design information is generally provided by different IC designers in different ways and in different formats. Additionally, the design information may be provided through oral information, paper data, fax data or e-mail attachment files. Different IC designers provide different descriptions for design information, some of which may be insufficient or redundant. Furthermore, inconsistent formatting can cause even more difficulties in integrating mask tooling information. Therefore, conventional multi-project wafer service encounters problems in tape-out processes for design service providers.

Second, it is difficult for a mask house, such as mask house 250, to produce a multi-project wafer on behalf of a design service provider, such as design service provider 230, according to the operation of conventional multi-project wafer service. Mask house is suffered by the poor data quality from design service provider. Maybe there is different definition on masks information between design service provider and mask house. On the other hand, the design service provider didn't have enough knowledge on integration of different devices from different customers. If someone (like foundry player) has enough experience on MPW integration, maybe he can help the design service provider to perform the integration service.

Hence, there is a need for a MPW service system that addresses problems arising from the existing technology. And it can open to different design service provider to use it and maintain the good data quality on information integration, just like the expert did.

SUMMARY

It is therefore an object of the invention to provide a system and method for multi-project wafer service to enhance the overall efficiency of IC prototyping for design service providers. To achieve this and other objects, the present invention provides a system and method of multi-project wafer service providing access to a design service provider and clients thereof (most of whom are IC designers).

According to the invention, a multi-project wafer service is provided by a third party other than design service providers and IC designers. The system for multi-project wafer service contains first and designer interfaces, an account managing device, a mask tooling information processor, a mask database checking device, and a mask tooling information convertor.

The integrator interface provides access to the multi-project wafer service for a first user. The designer interface provides access to the multi-project wafer service for a second user. The account managing device manages identification information and corresponding access authority for the first and second users. The mask tooling information processor provides a predefined form to the designer interface for mask tooling information, receives the form containing the mask tooling information, and presents the completed form to the integrator interface. The mask database checking device compares the mask tooling information to data stored in a predefined mask database, wherein the comparison is performed in response to a command from the IC designer (in case the system detected the IC designer submit his mask tooling information to integrator interface). The mask tooling information convertor converts the mask tooling information of different devices into one mask tape-out information, the translation performed in response to a command from the integrator interface.

The invention also provides a method for multi-project wafer service implemented in the described system. First, integrator and designer interfaces provide first and second users with access the multi-project wafer service. Second, a predefined form is provided to the designer interface for mask tooling information. The form containing the mask tooling information is then received and presented to the integrator interface. Next, the mask tooling information is converted into mask tape-out information. The tape-out information is then sent to a mask house for mask fabrication.

The above-mentioned method may take the form of program code embodied in a computer readable tangible media. When the program code is loaded into and executed by a machine, the machine becomes an apparatus for practicing the invention.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

Figure 3:
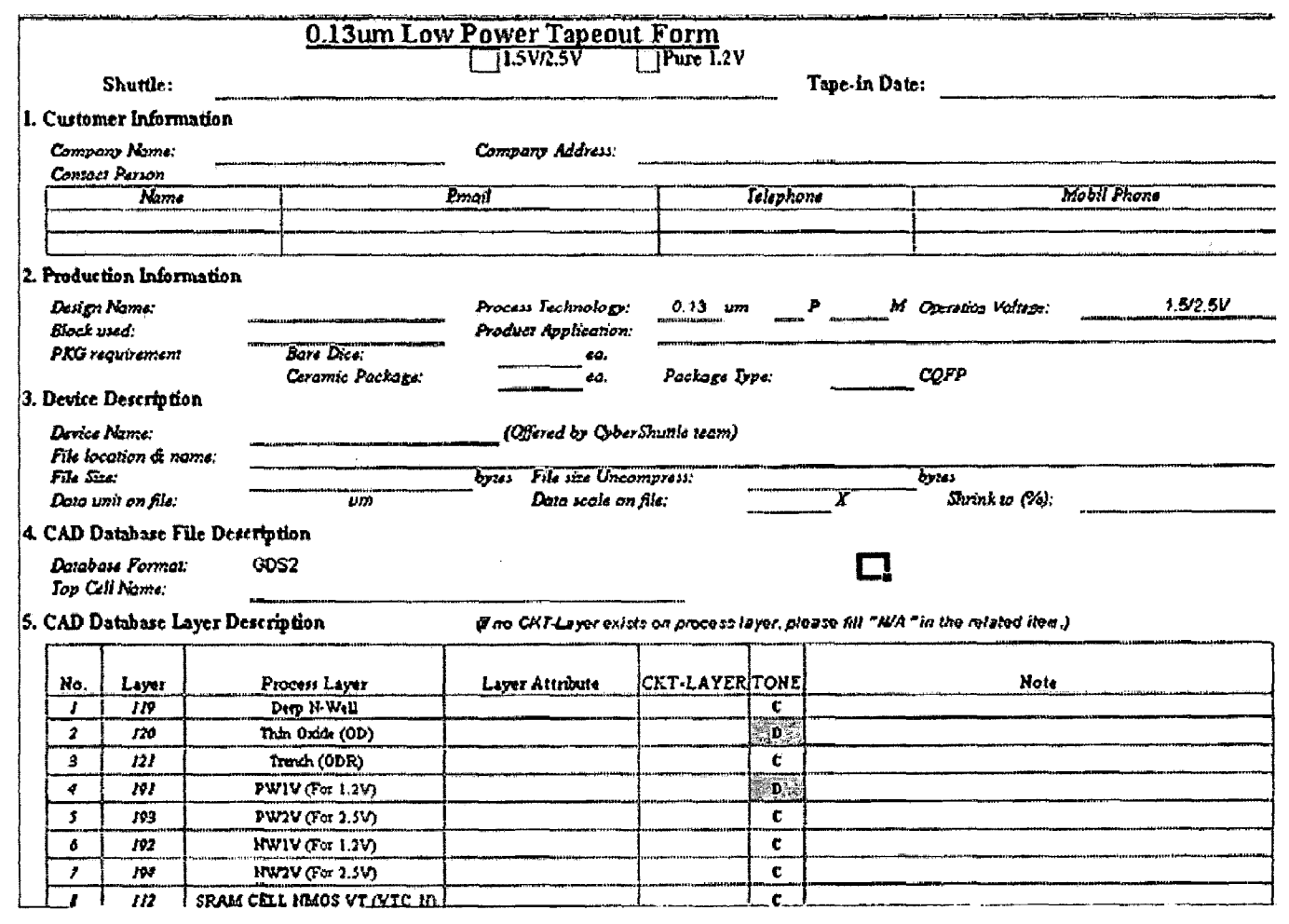

FIG. 3 illustrates a conventional form for mask tooling information;

FIG. 7 illustrates a form for mask tooling information according to the present invention.

DETAILED DESCRIPTION

The present invention is now described with reference to FIGS. 4 to 8, which in general relate to a system for multi-project wafer service within a wafer fabrication system.

Figure 1:
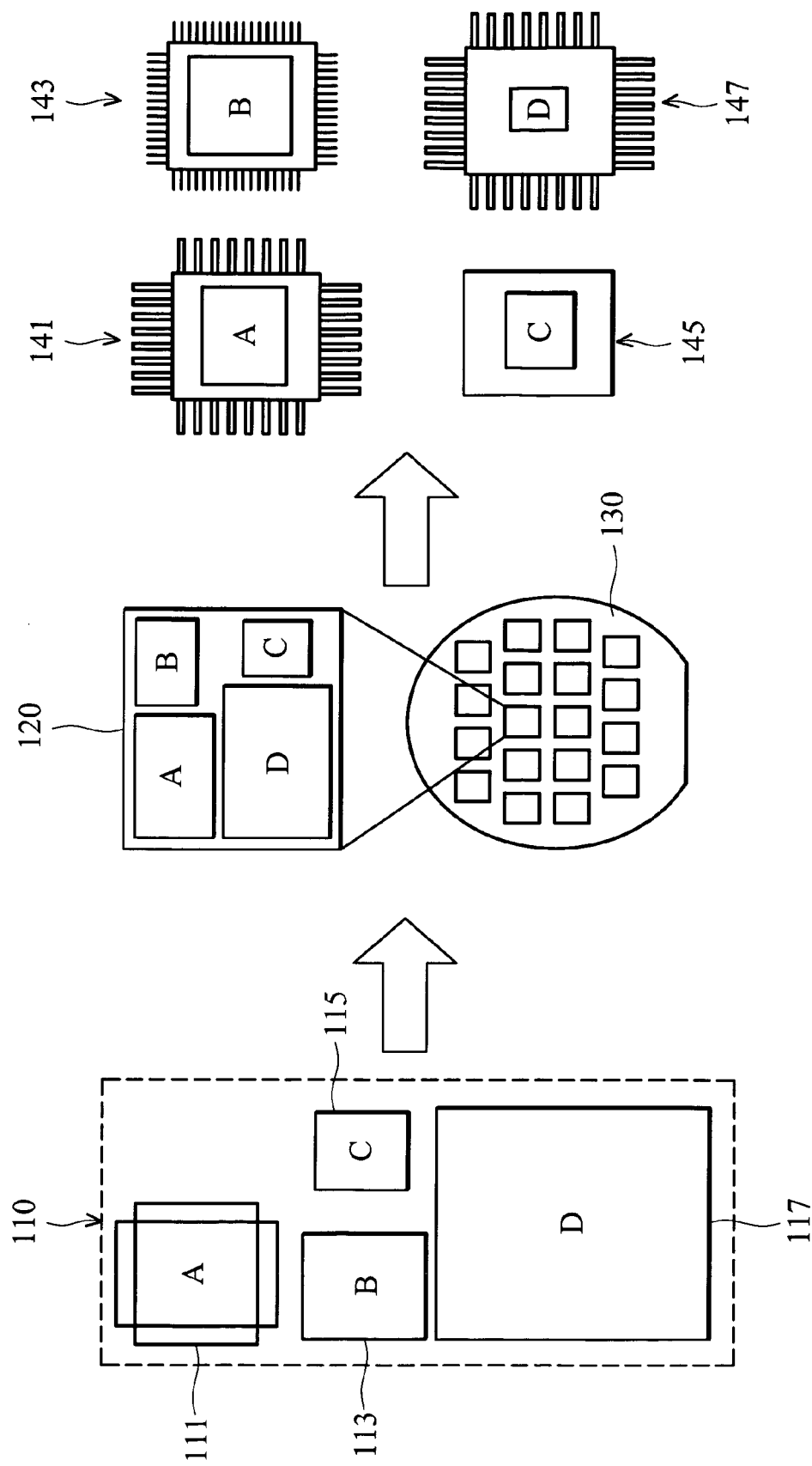
FIG. 1 is a schematic view of a conventional MPW service.
Figure 2:
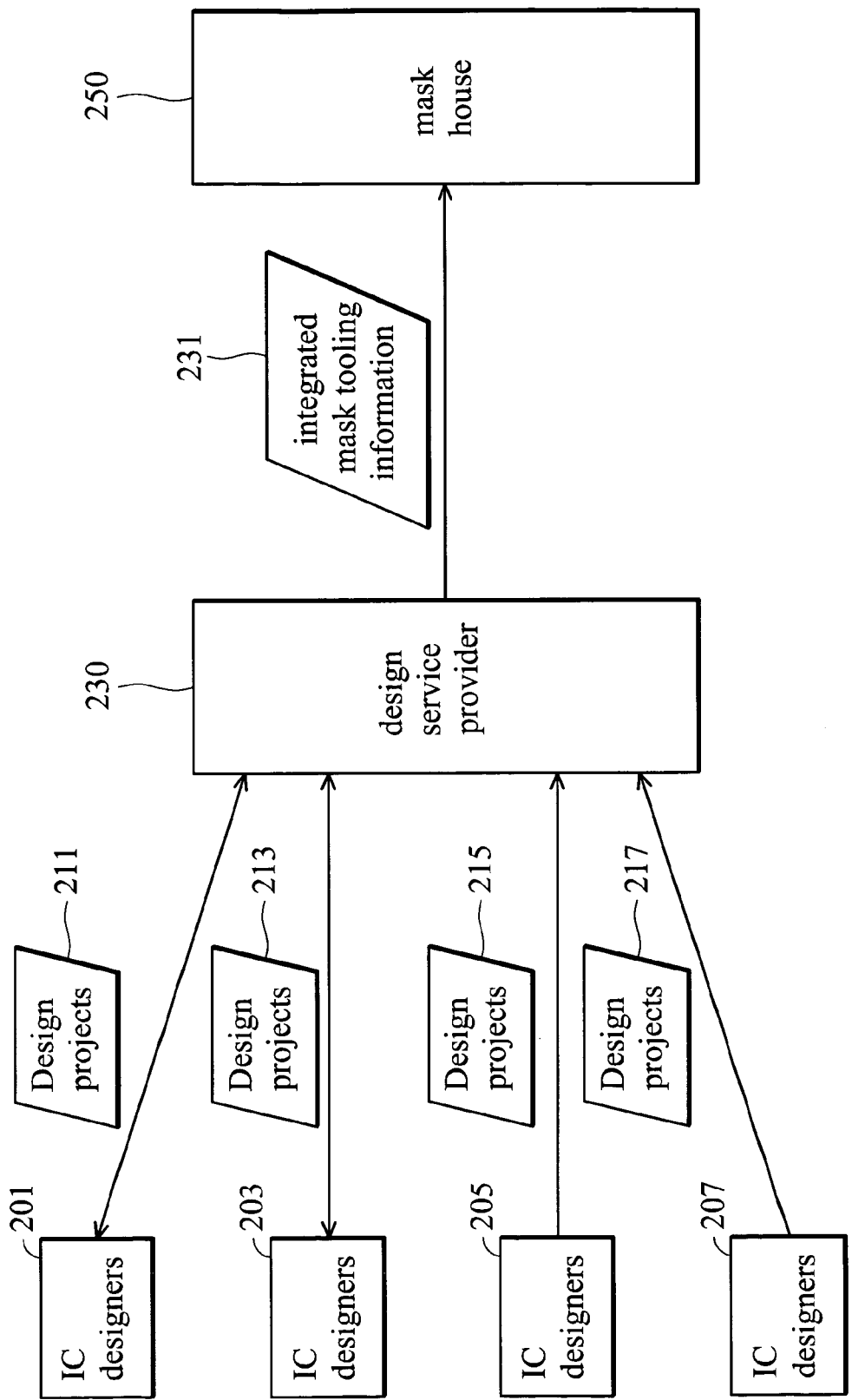
FIG. 2 illustrates operation of a conventional MPW service.
Figure 4:
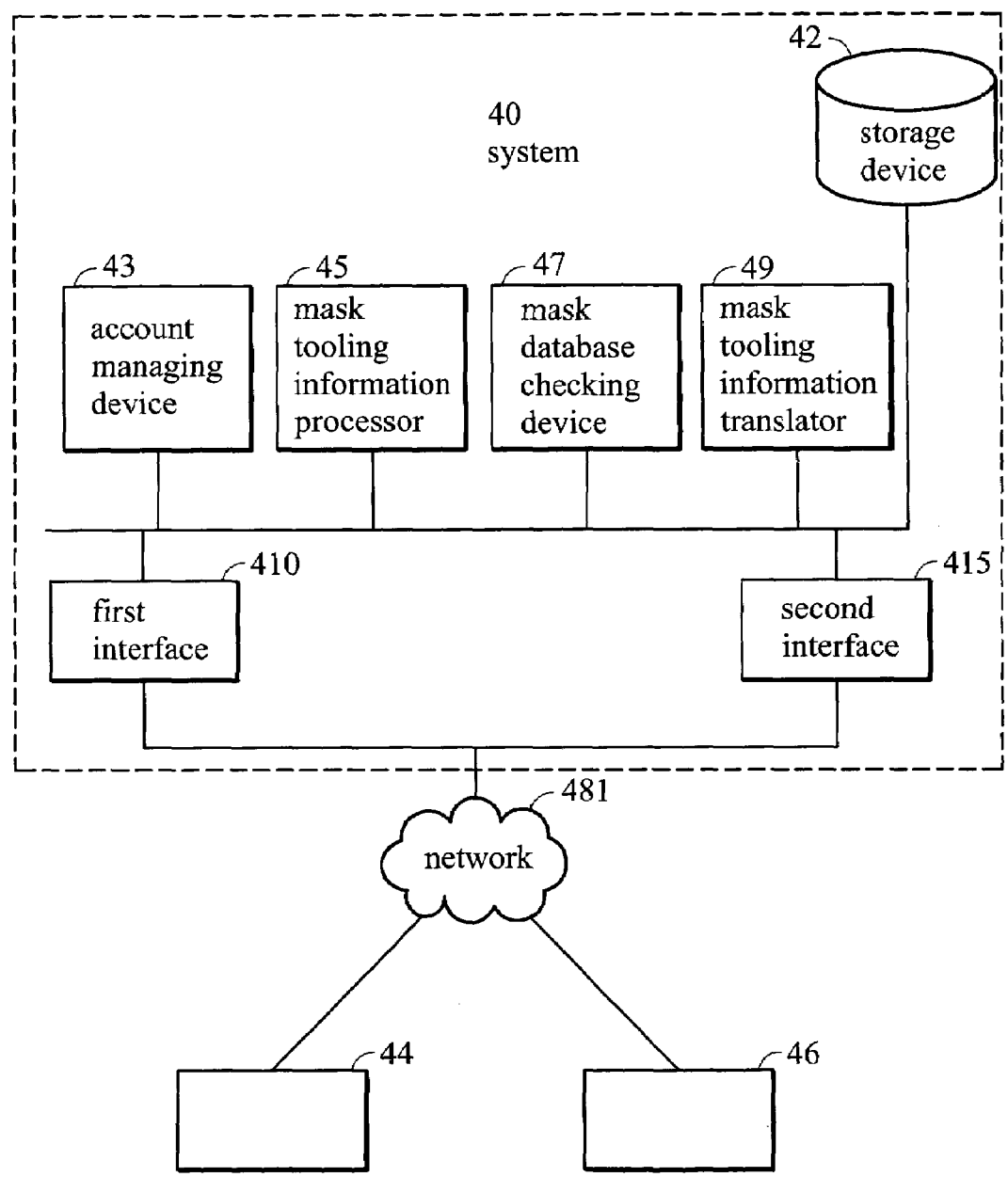
FIG. 4 is a schematic view of a system of multi-project wafer service according to the present invention.

FIG. 4 is a schematic view of a system for multi-project wafer service according to the present invention. The system 40 provides multi-project wafer service to a design service provider and clients thereof, wherein the clients are generally IC designers. The system 40 comprises a integrator interface 410, a designer interface 415, an account managing device 43, a mask tooling information processor 45, a mask database checking device 47, a mask tooling information convertor 49, and a storage device 42.

The integrator interface 410 communicates with computer device 44 through a network 481. The integrator interface 410 provides access to the multi-project wafer service for a design service provider using the computer device 44. The designer interface 415 communicates with computer device 46 through network 481. The designer interface 415 provides access to the multi-project wafer service for an IC designer using computer device 46. The IC designer is a client for the design service provider.

The account managing device 43 manages identification information and corresponding access authority for the design service provider and the IC designer.

The mask tooling information processor 45 provides a predefined form to the designer interface for mask tooling information, receives the form containing the mask tooling information, and presents the completed form to the integrator interface. The design service provider modifies a preset template to generate a form to meet specific requirements. The preset template is provided by the multi-project wafer service system and stored in the storage device 42.

The mask database checking device 47 compares the mask tooling information to data stored in the storage device 42, wherein the comparison is performed in response to IC designer and the result will be sent to both the IC designer and the design service provider. If there is no error found on this comparison, the system will inform the design service provider that this device has passed the mask database checking.

The mask tooling information convertor 49 converts the mask tooling information to mask tape-out information, wherein the translation is performed according to a command from the integrator interface. In other words, the comparison is performed according to the demands of the design service provider.

The aforementioned integrator interface 410, designer interface 42, account managing device 43, mask tooling information processor 45, mask database checking device 47, and mask tooling information convertor 49 are connected to a local network 481 and communicate with each other via the local network 481.

Figure 5:
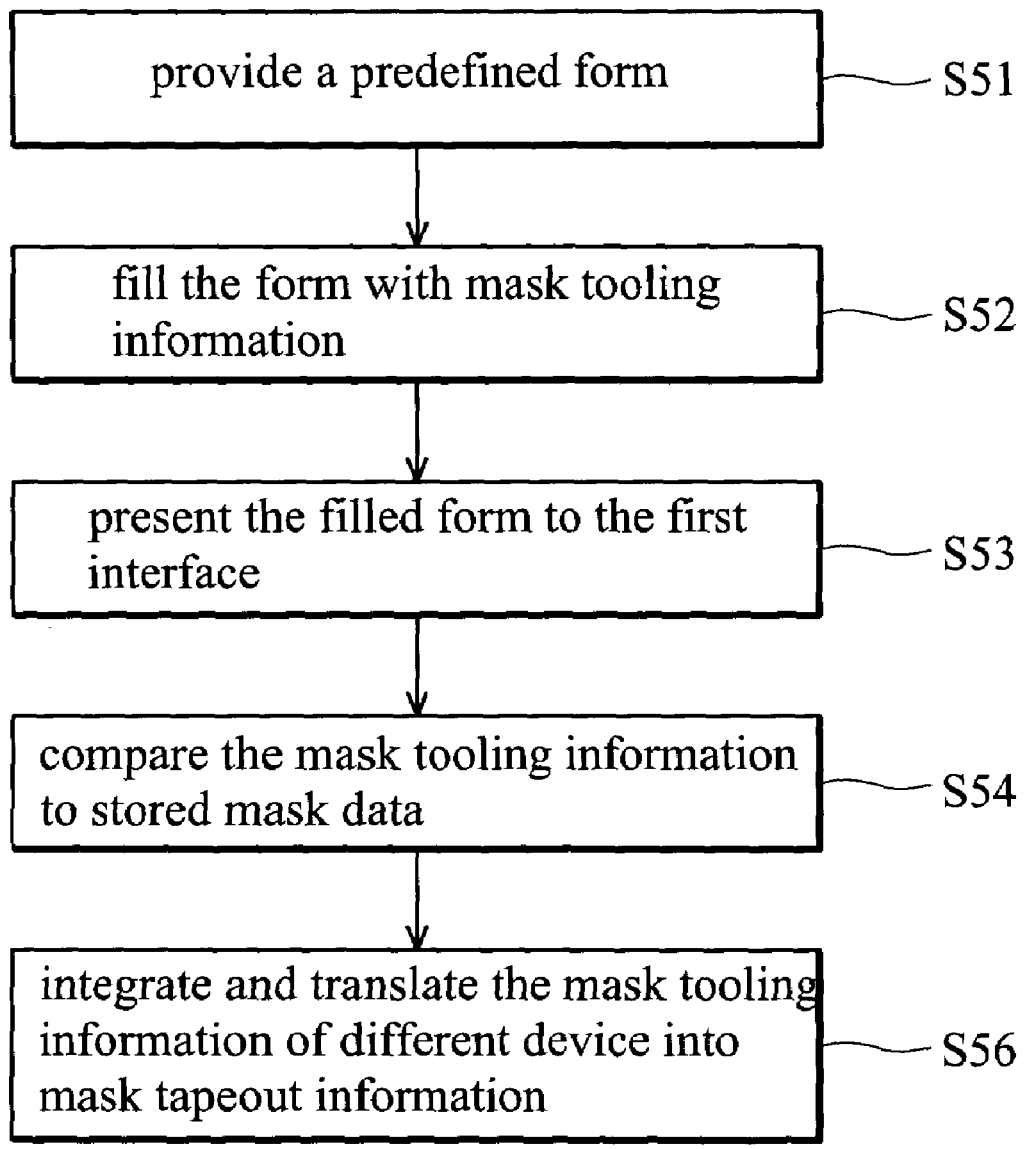
FIG. 5 is a flowchart of a method for multi-project wafer service of the system in FIG. 4.

The invention also provides a method for multi-project wafer service within the system mentioned above. FIG. 5 is a flowchart of a method for multi-project wafer service of the system in FIG. 4.

First, a predefined form is provided to the designer interface for mask tooling information (step S51). The form is generally provided by a design service provider under authority verification in the integrator interface.

The form is then completed with the mask tooling information by a user of the designer interface such as an IC designer (step S52). The completed form is then presented to the integrator interface according to the demands of the design service provider via the integrator interface (step S53). The mask tooling information is then compared to data stored in the storage device 32 (step S54). If no error found during the remote mask database checking, the mask tooling information is then integrated and translated to a mask house to fabricate a mask accordingly (step S56).

Figure 6:
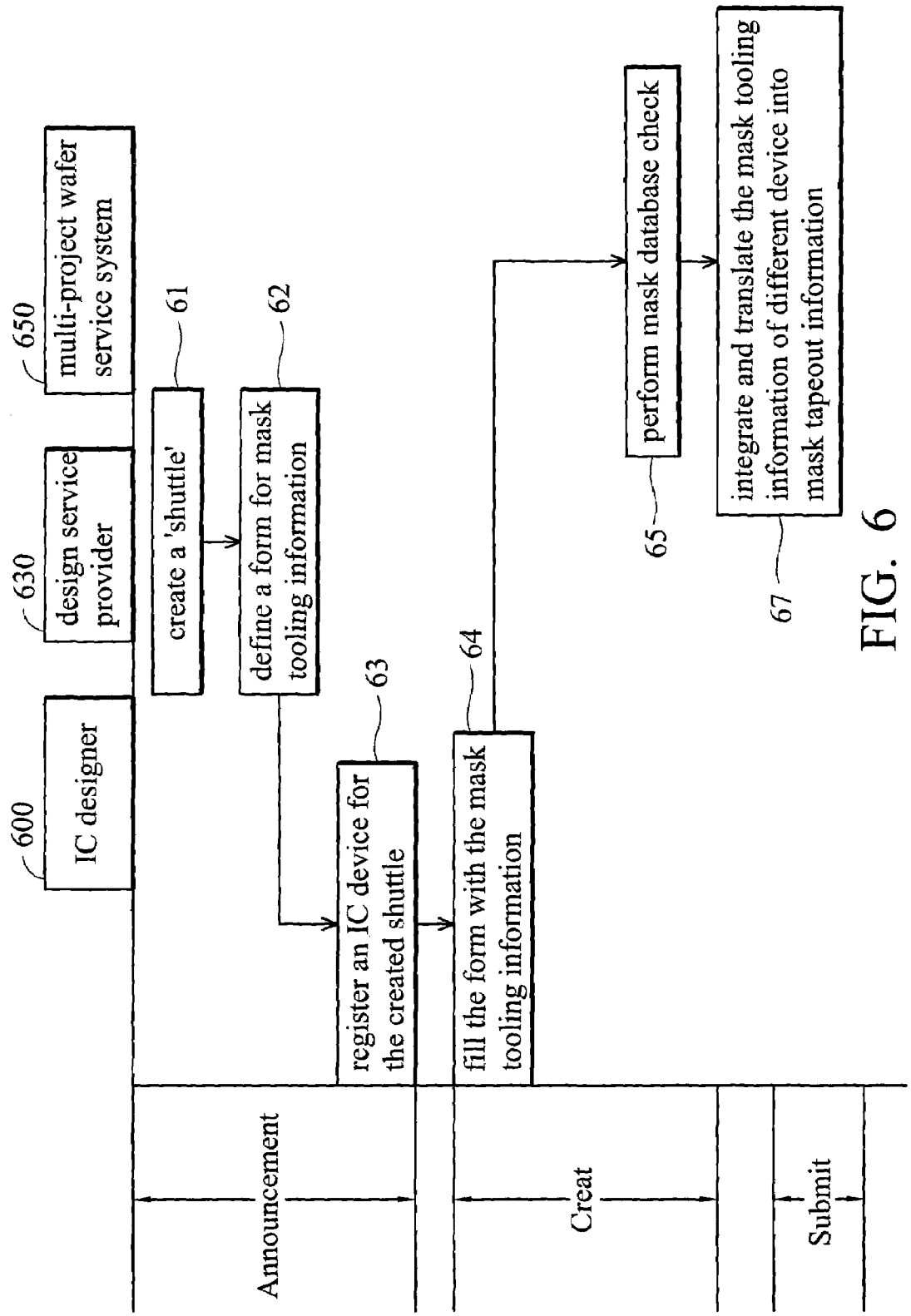
FIG. 6 illustrates operation of the multi-project wafer service according to the embodiment of the present invention.

An example here illustrates operation of the multi-project wafer service, with reference to FIG. 6.

First, a design service provider 630 creates a 'shuttle' to provide a multi-project wafer service for IC designers based on the multi-project wafer service system hosted by the foundry player (or maybe the masking house), as shown in block 61. At the same time, the design service provider 630 defines a form for mask tooling information (block 62), wherein the form is modified from a template provided by the multi-project wafer service system 650. The shuttle is then announced in the multi-project wafer service platform, such that a user 600 can register an IC device for the created shuttle (block 63). When the number of registered IC devices reaches a preset value, the multi-project wafer service corresponding to the shuttle is provided. When a client, having registering an IC device, logs into the multi-project wafer service platform, the predefined form is then presented via the user interface, allowing entry of mask tooling information for a IC device in the predefined form. FIG. 7 shows a form for mask tooling information according to the present invention. The form is then populated with the mask tooling information (block 64). A mask database check is then performed on the multi-project wafer service platform at the command of the IC designer (in case the system detected the IC designer submit his mask tooling information to integrator interface) (block 65), wherein the mask database check compares the mask tooling information to mask data stored in a mask database. The mask tooling information is then converted into mask tape-out information. The converted tape-out information is then integrated and transferred to a mask house for fabrication of a mask accordingly (block 67).

The method for multi-project wafer service implemented in the system of the present invention, or certain aspects or portions thereof, may take the form of program code (i.e. instructions) embodied in a tangible media, such as floppy diskettes, CD-ROMS, hard drives, or any other machine-readable storage medium, wherein, when the program code is loaded into and executed by a machine, such as -a computer, the machine becomes an apparatus for practicing the invention. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

Figure 8:
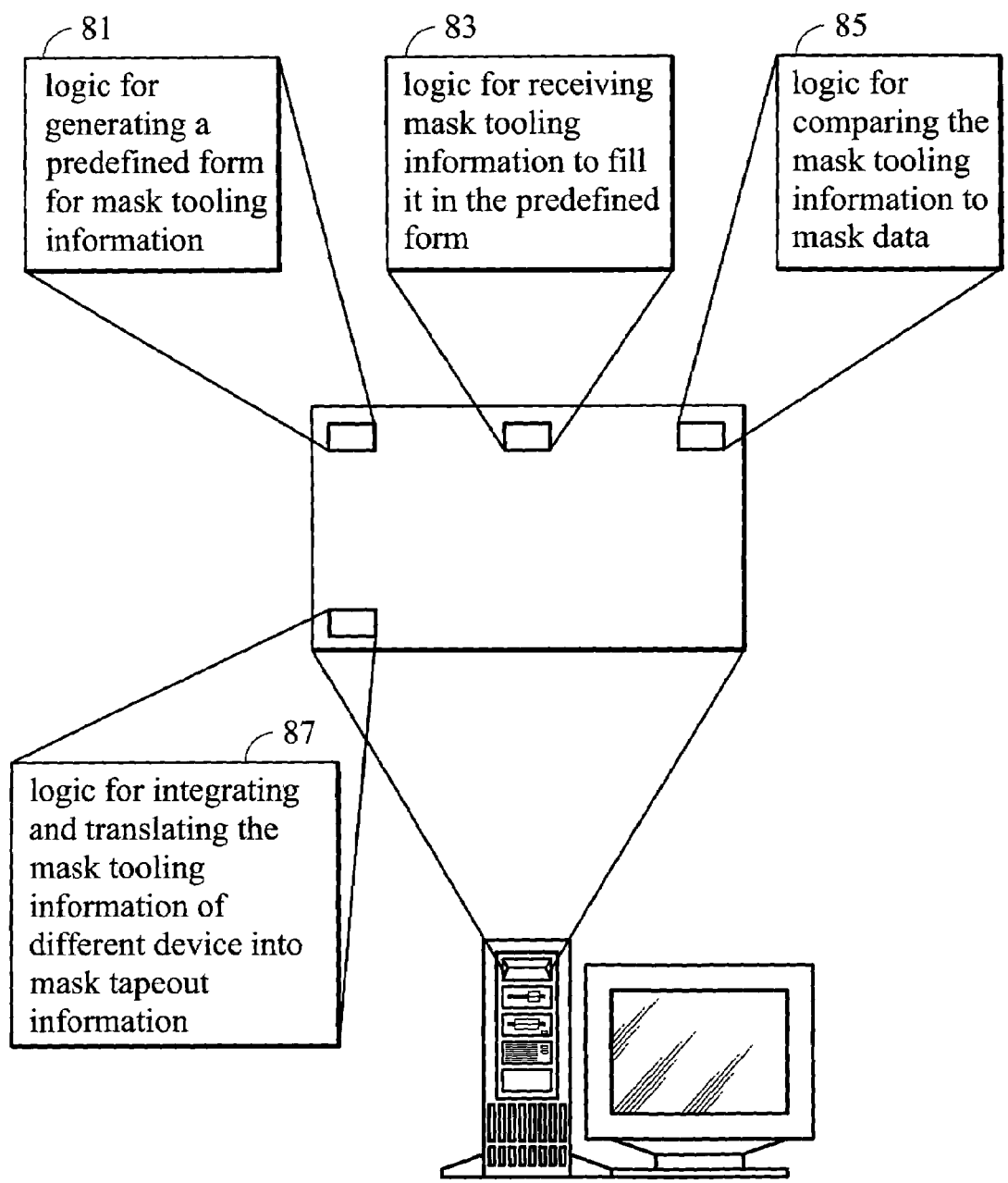
FIG. 8 is a diagram of a storage medium storing a computer program providing the method for multi-project wafer service of the present invention.

FIG. 8 is a schematic diagram of a storage medium for a computer program providing the method for multi-project wafer service according to the present invention. The computer program product includes a storage medium having computer readable program code embodied in the medium for use in a computer system, the computer readable program code comprising at least computer readable program code 81 generating a predefined form for mask tooling information, computer readable program code 83 receiving mask tooling information for entry into the predefined form, computer readable program code 85 comparing the mask tooling information to mask data stored in a predefined mask database, and computer readable program code 87 converting the mask tooling information into mask tape-out information.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for multi-project wafer service, comprising: an integrator interface, providing access to the multi-project wafer service for a first user; a designer interface, providing access to the multi-project wafer service for a second user; an account managing device, managing identification information and corresponding access authority for the first and second users; a mask tooling information processor, providing a predefined form to the designer interface for mask tooling information, receiving the form containing the mask tooling information, and presenting the completed form to the integrator interface; a mask database checking device, comparing the mask tooling information to mask data stored in a predefined mask database, wherein the comparison is performed in response to a command from an IC designer; and mask tooling information convertor, converting the mask tooling information of different device into one mask tape-out information, wherein the conversion is performed in response to a command from the integrator interface.

2. The system of claim 1, wherein the account managing device further performs identity verification based on preset identification information and login information transmitted from the integrator and designer interfaces.

3. The system of claim 1, wherein the mask tooling information processor further modifies the predefined form according to a command from the integrator interface.

4. The system of claim 1, wherein the mask tooling information processor further compares current version of mask tooling information and previous version of mask tooling information, and generates a comparison report accordingly.

5. The system of claim 1, wherein the mask tooling information specifies a plurality of design projects for different IC devices.

6. The system of claim 1, wherein the mask database checking device compares mask layer information in the mask tooling information and corresponding design circuit file in the mask database.

7. The system of claim 1, wherein the mask database checking device compares the structure name of in the mask tooling information to corresponding design circuit file in the mask database.

8. The system of claim 1, wherein the mask database checking device compares window size information in the mask tooling information to corresponding design circuit file in the mask database.

9. The system of claim 1, wherein the mask database checking device compares data type information in the mask tooling information to corresponding design circuit file in the mask database.

10. A system for multi-project wafer service, comprising: a designer interface, providing access for at least one IC designer to information service uploading a plurality of design projects for different IC devices; an integrator interface, providing access for a design service provider to an integration service integrating the design projects from IC designers into integrated mask tooling information for a multi-project wafer production; an account managing device, managing identification information and corresponding access authority for the IC designer and the design service provider; and a processing device, providing the information and integration services to the design service provider and IC designer via the integrator and designer interfaces, respectively.

11. The system of claim 10, wherein the account managing device further performs identity verification based on preset identification information and login information transmitted from the integrator and designer interfaces.

12. The system of claim 10, wherein the processing device provides a predefined form to the designer interface for receiving the uploaded design projects, receives the form containing a design project, and presents the completed form to the integrator interface.

13. The system of claim 12, wherein the account managing device further grants authority to the design service provider to modify the predefined form.

* * * * *